United States Patent
Chen et al.

(10) Patent No.: US 9,983,474 B2
(45) Date of Patent: May 29, 2018

(54) PHOTORESIST HAVING SENSITIZER BONDED TO ACID GENERATOR

(71) Applicant: TAIWAN SEMICONDUCTOR MANUFACTURING COMPANY, LTD., Hsin-Chu (TW)

(72) Inventors: Yen-Hao Chen, Hsin-Chu (TW); Chien-Wei Wang, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

(21) Appl. No.: 14/851,093

(22) Filed: Sep. 11, 2015

(65) Prior Publication Data
US 2017/0075216 A1   Mar. 16, 2017

(51) Int. Cl.
G03F 7/038 (2006.01)
G03F 7/039 (2006.01)
G03F 7/20 (2006.01)
G03F 7/30 (2006.01)
G03F 7/004 (2006.01)

(52) U.S. Cl.
CPC ............ G03F 7/0045 (2013.01); G03F 7/004 (2013.01); G03F 7/038 (2013.01); G03F 7/039 (2013.01); G03F 7/2004 (2013.01); G03F 7/2059 (2013.01); G03F 7/30 (2013.01)

(58) Field of Classification Search
None
See application file for complete search history.

(56) References Cited

U.S. PATENT DOCUMENTS

| 6,296,984 B1 * | 10/2001 | Gabor ............... G03F 7/0045 430/270.1 |
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2010/0233621 A1 * | 9/2010 | Yamamoto ......... C07D 333/34 430/281.1 |
| 2011/0112306 A1 * | 5/2011 | Nagamori ............ C07C 25/18 548/435 |

(Continued)

FOREIGN PATENT DOCUMENTS

| CN | 101925594 | 12/2010 |
| CN | 101930173 | 12/2010 |
| JP | 10-312056 | * 11/1998 |

OTHER PUBLICATIONS

Taiwanese Application No. 105129062, Office Action dated Feb. 8, 2017, 7 pgs.

*Primary Examiner* — Sin J Lee
(74) *Attorney, Agent, or Firm* — Haynes & Boone, LLP

(57) ABSTRACT

The present disclosure is directed to a photoresist and a method of performing a lithography process using the photoresist. The photoresist contains a polymer and a photo-acid generator. The photo-acid generator contains a sensitizer component, an acid generator component, and a bonding component that bonds the sensitizer component to the acid generator component. The bonding component may be either a single bond or a conjugated bond. The lithography process may be an EUV lithography process or an e-beam lithography process.

19 Claims, 11 Drawing Sheets

Formula III

(56) References Cited

U.S. PATENT DOCUMENTS

| | | | |
|---|---|---|---|
| 2013/0202999 A1* | 8/2013 | Iwato | G03F 7/004 430/270.1 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2014/0349223 A1* | 11/2014 | Kawabata | G03F 7/0045 430/18 |

* cited by examiner

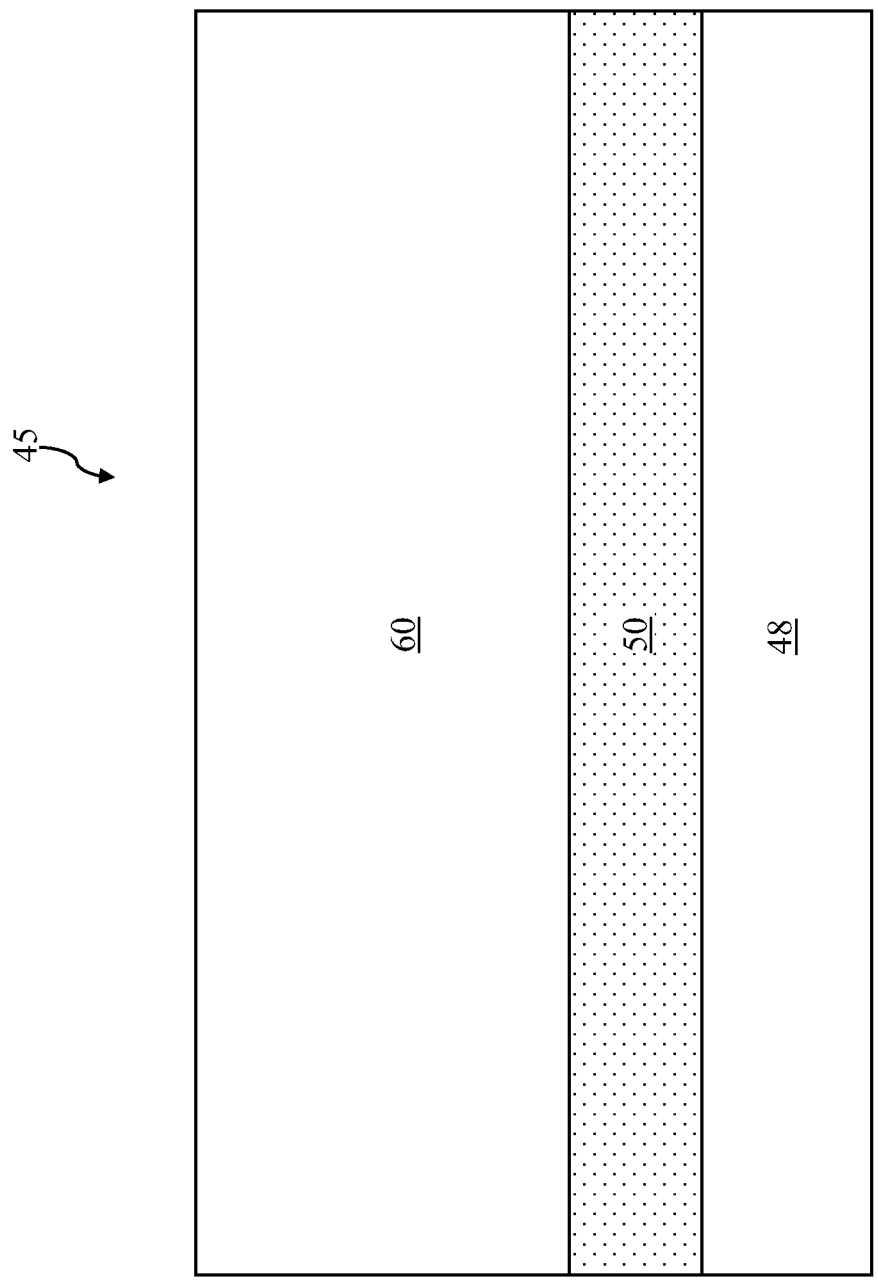

PHOTORESIST HAVING SENSITIZER BONDED TO ACID GENERATOR

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, EUV lithography still has some shortcomings related to photoresist, for example shortcomings with respect to sensitivity and/or efficiency. As a result, lithography performance may be compromised or degraded.

Therefore, while existing photoresist materials have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3 and 8-10 are diagrammatic cross-sectional side views of a semiconductor device at various stages of fabrication in accordance with some embodiments of the present disclosure.

DETAILED DESCRIPTION

Figure 1:
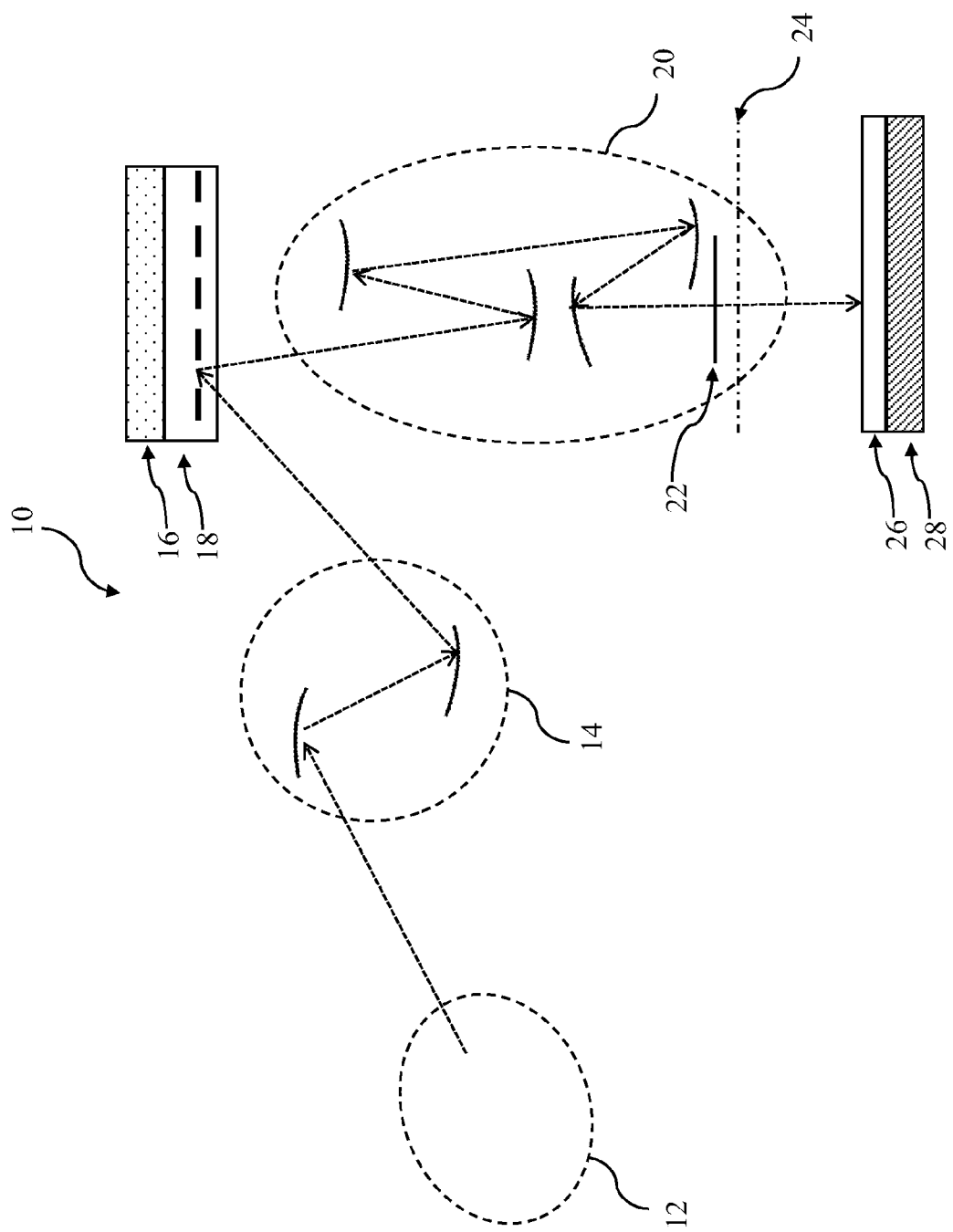
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes, for example for 20 nanometer (nm) technology nodes or smaller. However, EUV lithography may have shortcomings with photoresist sensitivity and efficiency. For example, due to the low source power of EUV tools, it is desirable to have a high sensitivity of the photoresist with efficient generator in order to offer high sensitivity. According to the acid generation mechanisms (by EUV light), multiple secondary electrons are excited from the sensitizer of the photoresist by the EUV photons. The energy of secondary electrons decay by thermal relaxation. Then the thermal electrons can be used by acid generator and release proton acid. However, this process may suffer from poor acid generation efficiency due to difficulty in controlling the acid generator uniformly distributed throughout the photoresist and the distance of the sensitizer and the acid generator, which makes it hard to control the electron transfer. As a result, photoresist sensitivity and efficiency may be adversely affected.

The present disclosure provides a novel photoresist having a sensitizer that is linked or bonded to the acid generator. This offers more control for the electron transfer, as well as limiting the distance in which the electron has to transfer. Consequently, photoresist sensitivity and efficiency are improved. The various aspects of the present disclosure will be discussed below in greater detail with reference to FIGS. 1-11. First, a EUV lithography system will be discussed below with reference to FIGS. 1-2. Next, the details of the novel photoresist will be discussed below with reference to FIGS. 4-7. Finally, the lithography process employing the photoresist will be discussed with reference to FIGS. 3 and 8-11.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes TiO2 doped SiO2, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
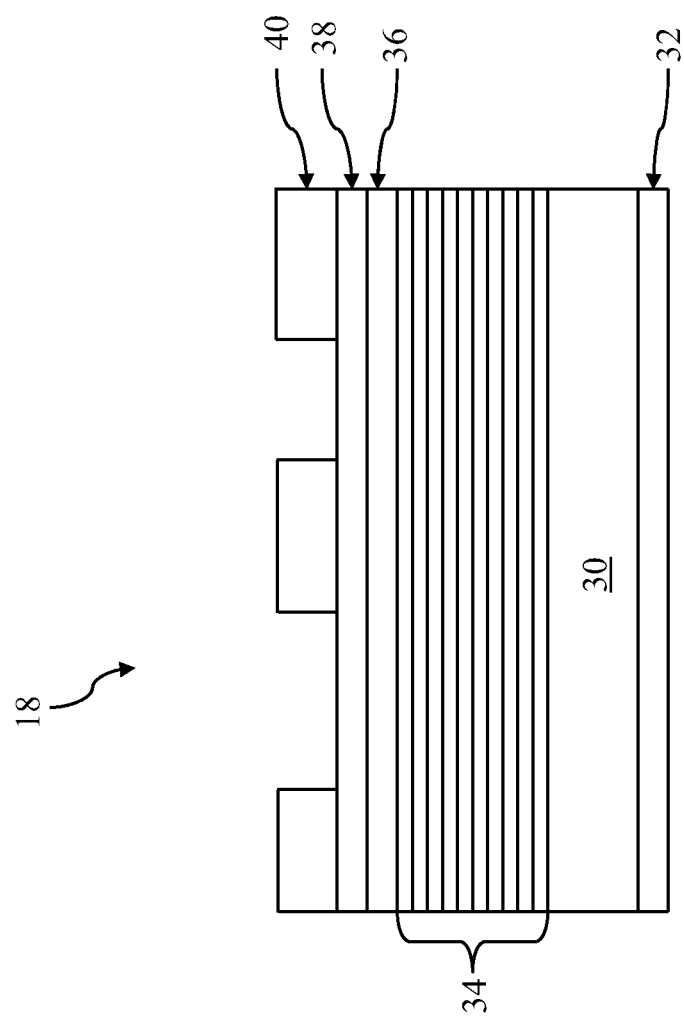
FIG. 2 is a sectional view of a EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include TiO2 doped SiO2, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

FIGS. 3 and 8-10 are diagrammatic fragmentary cross-sectional side views of a semiconductor device 45 at various stages of fabrication in accordance with various aspects of the present disclosure. The semiconductor device 45 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 3, a semiconductor device 45 includes a substrate 48. In some embodiments, the substrate 48 is a silicon substrate doped with a p-type dopant such as boron (for example a p-type substrate). Alternatively, the substrate 48 could be another suitable semiconductor material. For example, the substrate 48 may be a silicon substrate that is doped with an n-type dopant such as phosphorous or arsenic (an n-type substrate). The substrate 48 could include other elementary semiconductors such as germanium and diamond. The substrate 48 could optionally include a compound semiconductor and/or an alloy semiconductor. Further, the substrate 48 could include an epitaxial layer (epi layer), may be strained for performance enhancement, and may include a silicon-on-insulator (SOI) structure.

In some embodiments, the substrate 48 is substantially conductive or semi-conductive. The electrical resistance may be less than about $10^3$ ohm-meter. In some embodiments, the substrate 48 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 48 may contain Ti, Al, Co, Ru, TiN, WN2, or TaN.

In some other embodiments, the substrate 48 contains a dielectric material with a dielectric constant in a range from about 1 to about 40. In some other embodiments, the substrate 48 contains Si, metal oxide, or metal nitride, where the formula is MXb, wherein M is a metal or Si, and X is N or O, and wherein "b" is in a range from about 0.4 to 2.5. For example, the substrate 48 may contain $SiO_2$, silicon nitride, aluminum oxide, hafnium oxide, or lanthanum oxide.

A material layer 50 is formed over the substrate 48. The material layer 50 can be patterned via a lithography process and as such may also be referred to as a patternable layer. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 48 and the material layer 50 may each include additional suitable material compositions in other embodiments.

A photoresist layer 60 is formed over the material layer 50. In the embodiment shown in FIG. 3, the photoresist layer 60 includes a positive photoresist, but it is understood that the photoresist layer 60 may be a negative photoresist in alternative embodiments. The photoresist layer 60 may be formed by a spin-coating process. The photoresist layer 60 contains components such as a polymer, photo acid generators (PAG), quenchers, chromophore, surfactant, cross linker, etc. In an embodiment, the photo acid generator is bonded to the polymer. In a subsequent photolithography process, photons induce decomposition of the PAG. As a result, a small amount of acid is formed, which further induces a cascade of chemical transformations in the photoresist layer 60. The photoresist layer 60 may also optionally include a quencher that is disposed within the photoresist layer 60 in order to improve critical dimension (CD) control.

The photoresist layer 60 contains a photo-acid generator (PAG). According to the various aspects of the present disclosure, the photo-acid generator includes an acid generator component and a sensitizer component. The sensitizer component is also referred to as a sensitizer moiety, and it is bonded or linked to the acid generator through a linker.

Figure 4A:
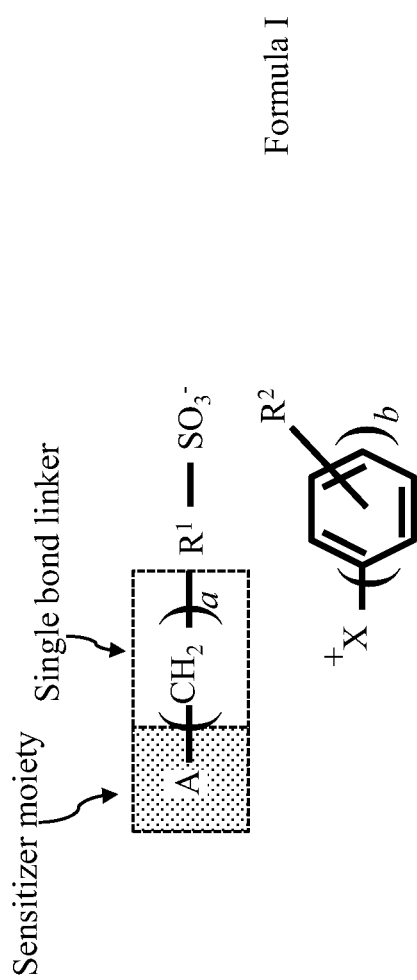
FIGS. 4A-4B, 5A-5B, and 6 each illustrate chemical formulas of portions of a photoresist material (or components thereof) in accordance with some embodiments of the present disclosure.
Figure 4B:
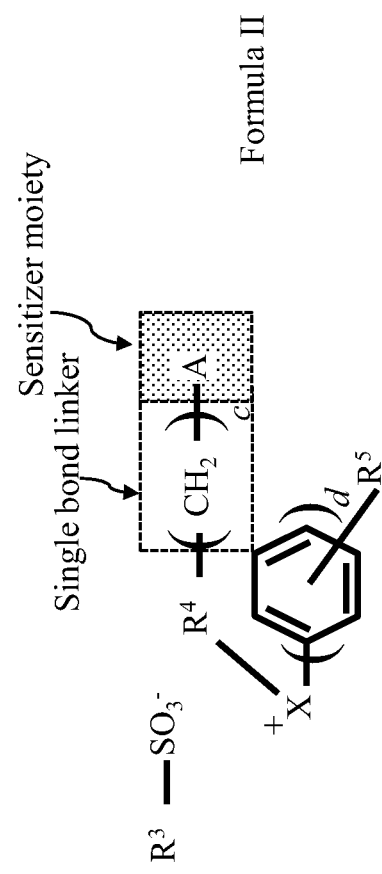

FIGS. 4A and 4B each illustrate a chemical formula for the PAG according to an embodiment of the present disclosure, where the sensitizer component is bonded to the acid generator component via a single bond. Specifically, FIG. 4A illustrates a PAG according to a formula I where the sensitizer moiety is bonded to an anion, and FIG. 4B illustrates a PAG according to a formula II where the sensitizer moiety is bonded to a cation. In both formulas I and II, A represents the sensitizer component (hereinafter interchangeably referred to as the sensitizer moiety), which is the photosensitive part of the PAG. In a EUV lithography system, such as the system 10 illustrated in FIG. 1, the sensitizer moiety A is configured to absorb EUV light to produce electrons. In various embodiments, the sensitizer moiety A may be a metal, a metal oxide, a metal complex, aromatic carbon ring derivatives, or heterocyclic derivatives.

With reference to FIG. 4A, the acid generator component of the PAG is represented by the following chemical formula:

The above acid generator component represents an anion. As the PAG contains both an anion and a cation, the cation of the PAG is represented by the following chemical formula (also shown in FIG. 4A):

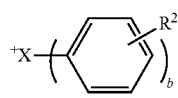

The acid generator component (the anion in this embodiment) is bonded or linked to the sensitizer moiety A through a linker (also referred to as a bonding component). The linker may be a material that contains carbon and hydrogen, for example an alkyl chain. In the embodiment shown in FIG. 4A, the linker is represented by the following chemical formula:

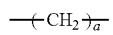

In some embodiments, $R^1$ is an aromatic carbon ring, or a straight or cyclic alkyl/alkoxyl/fluoro chain with the chain carbon 1~6, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6.

In some embodiments, $R^1$, $R^2$ may further comprise: —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; epoxyl groups. In some embodiments, R* may be H, or an unbranched or branched, cyclic or noncyclic saturated or unsaturated alkyl or alkenyl or alkynyl groups.

In some embodiments, a is in a range from about 1 to about 20, and b is in a range from about 1 to about 3.

The discussions above with reference to FIG. 4A describe a PAG with a sensitizer moiety bonded to an anion. This embodiment is referred to as formula I. The discussions below with reference to FIG. 4B describe a PAG with a sensitizer moiety bonded to a cation, and that embodiment is referred to as formula II.

With reference to FIG. 4B, the acid generator component of the PAG is represented by the following chemical formula:

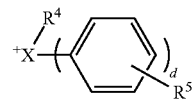

The above acid generator component represents a cation. As the PAG contains both an anion and a cation, the anion of the PAG is represented by the following chemical formula (also shown in FIG. 4B):

The acid generator component (the cation in this embodiment) is bonded or linked to the sensitizer moiety A through a linker (also referred to as a bonding component). The linker may be a material that contains carbon and hydrogen, for example an alkyl chain. In the embodiment shown in FIG. 4B, the linker is represented by the following chemical formula:

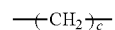

In some embodiments, $R^3$ and $R^4$ may each be an aromatic carbon ring, or a straight or cyclic alkyl/alkoxyl/fluoro chain with the chain carbon 1~6, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6.

In some embodiments, $R^3$, $R^4$ and $R^5$ may further comprise: —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; epoxyl groups. In some embodiments, R* may be H, or an unbranched or branched, cyclic or noncyclic saturated or unsaturated alkyl or alkenyl or alkynyl groups.

In some embodiments, c is in a range from about 1 to about 20, and d is in a range from about 1 to about 3.

Figures 5A, 5B:
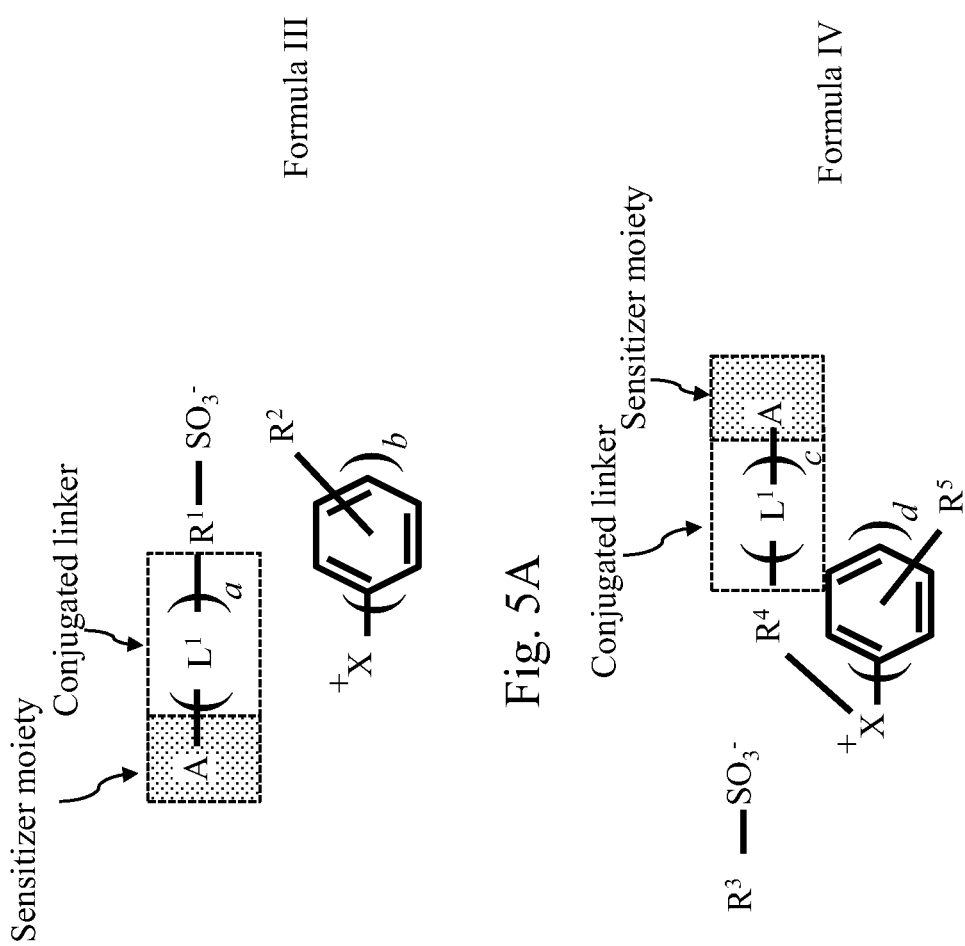
Figure 6:
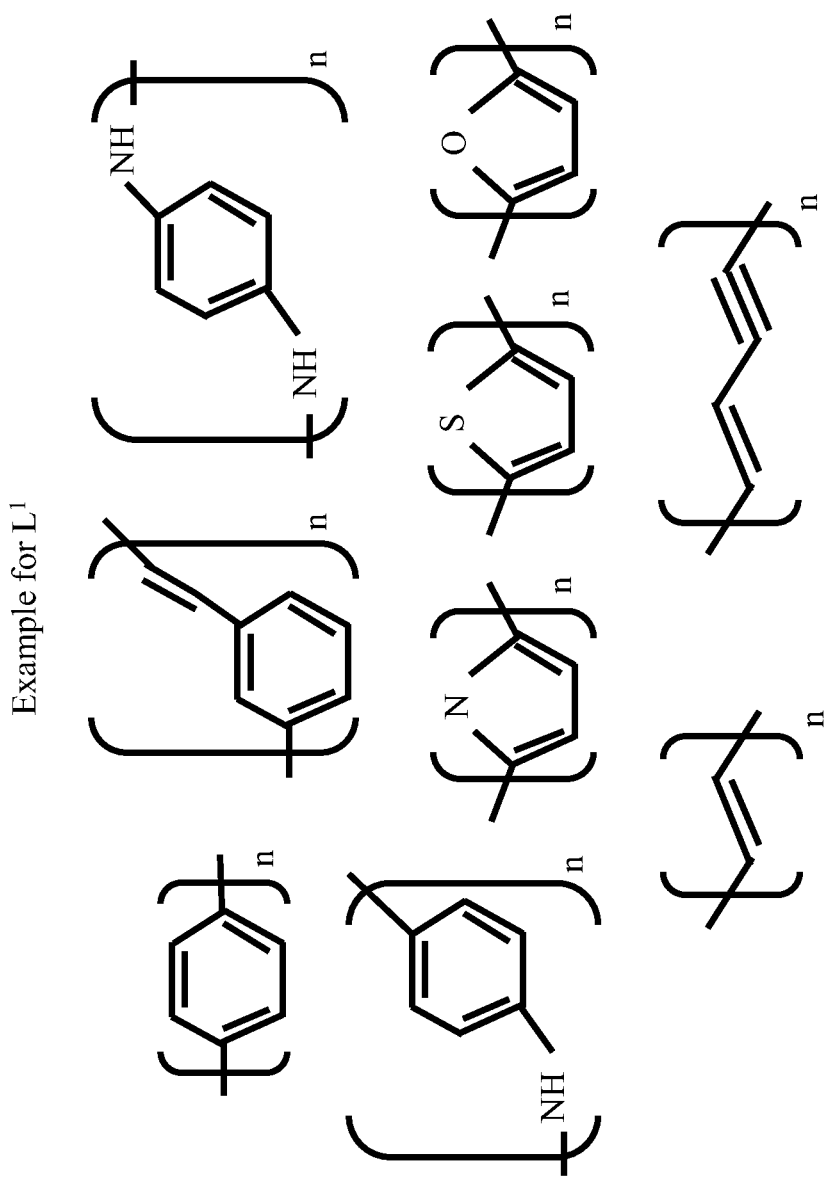

FIGS. 5A and 5B each illustrate a chemical formula for the PAG according to a different embodiment of the present disclosure, where the sensitizer component is bonded to the acid generator component via a conjugated bond. Specifically, FIG. 5A illustrates a PAG according to a formula III where the sensitizer moiety is bonded to an anion, and FIG. 5B illustrates a PAG according to a formula IV where the sensitizer moiety is bonded to a cation. In both formulas III and IV, A represents the sensitizer component (hereinafter interchangeably referred to as the sensitizer moiety), which is the photosensitive part of the PAG. In a EUV lithography system, such as the system 10 illustrated in FIG. 1, the sensitizer moiety A is configured to absorb EUV light to produce electrons. In various embodiments, the sensitizer moiety A may be a metal, a metal oxide, a metal complex, aromatic carbon ring derivatives, or heterocyclic derivatives.

With reference to FIG. 5A, the acid generator component of the PAG is represented by the following chemical formula:

The above acid generator component represents an anion. As the PAG contains both an anion and a cation, the cation of the PAG is represented by the following chemical formula (also shown in FIG. 5A):

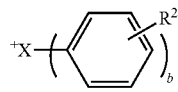

The acid generator component (the anion in this embodiment) is bonded or linked to the sensitizer moiety A through a conjugated linker $L^1$ (also referred to as a bonding component). The conjugated linker $L^1$ may be a conjugated organic group. The plurality of chemical formulas below (also shown in FIG. 6) represent the various embodiments of the organic group that may be used as the conjugated linker $L^1$:

Example for $L^1$

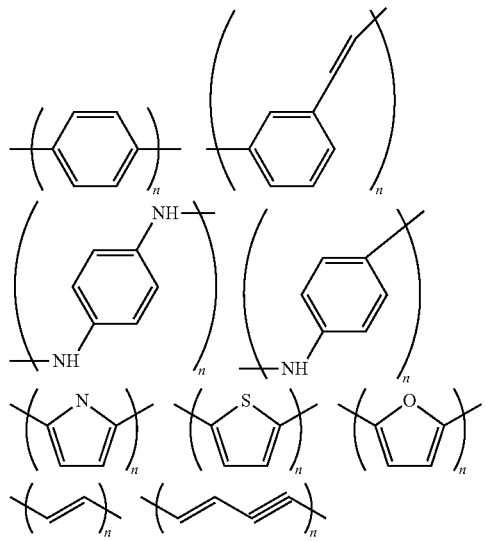

In some embodiments, $R^1$ is an aromatic carbon ring, or a straight or cyclic alkyl/alkoxyl/fluoro chain with the chain carbon 1~6, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6.

In some embodiments, $R^1$, $R^2$ may further comprise: —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; epoxyl groups. In some embodiments, R* may be H, or an unbranched or branched, cyclic or noncyclic saturated or unsaturated alkyl or alkenyl or alkynyl groups.

In some embodiments, a is in a range from about 1 to about 20, n is in a range from about 1 to about 20, and b is in a range from about 1 to about 3.

The discussions above with reference to FIG. 5A describe a PAG with a sensitizer moiety bonded to an anion. This embodiment is referred to as formula III. The discussions below with reference to FIG. 5B describe a PAG with a sensitizer moiety bonded to a cation, and that embodiment is referred to as formula IV.

With reference to FIG. 5B, the acid generator component of the PAG is represented by the following chemical formula:

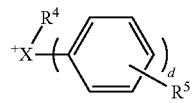

The above acid generator component represents a cation. As the PAG contains both an anion and a cation, the anion of the PAG is represented by the following chemical formula (also shown in FIG. 5B):

The acid generator component (the cation in this embodiment) is bonded or linked to the sensitizer moiety A through a conjugated linker $L^1$ (also referred to as a bonding component). The conjugated linker $L^1$ may be a conjugated organic group. The plurality of chemical formulas below (also shown in FIG. 6) represent the various embodiments of the organic group that may be used as the conjugated linker $L^1$:

Example for $L^1$

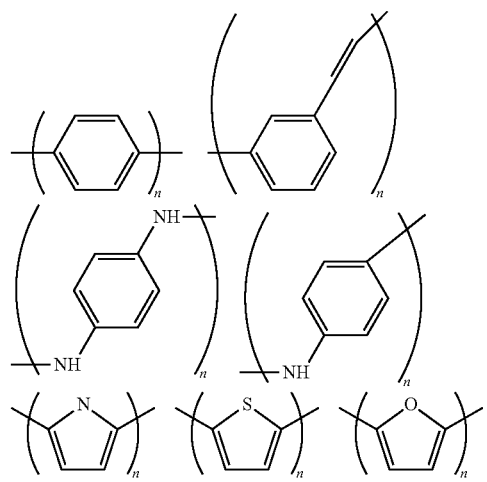

-continued

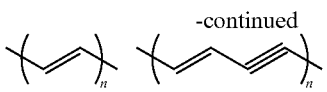

In some embodiments, $R^3$ and $R^4$ may each be an aromatic carbon ring, or a straight or cyclic alkyl/alkoxyl/fluoro chain with the chain carbon 1~6, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6.

In some embodiments, $R^3$, $R^4$ and $R^5$ may further comprise: —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; epoxyl groups. In some embodiments, R* may be H, or an unbranched or branched, cyclic or noncyclic saturated or unsaturated alkyl or alkenyl or alkynyl groups.

In some embodiments, c is in a range from about 1 to about 20, n is in a range from about 1 to about 20, and d is in a range from about 1 to about 3.

Figure 7A:
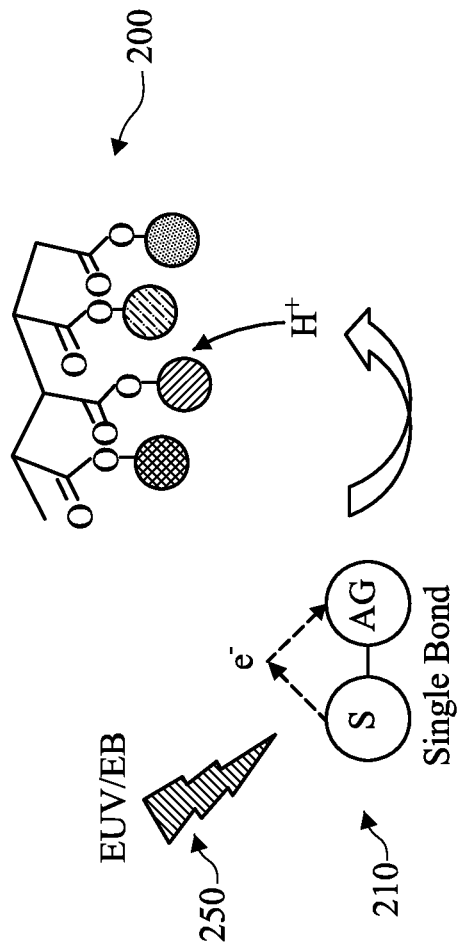
FIGS. 7A-7B are diagrams illustrating photo-acid generation in accordance with some embodiments of the present disclosure.
Figure 7B:
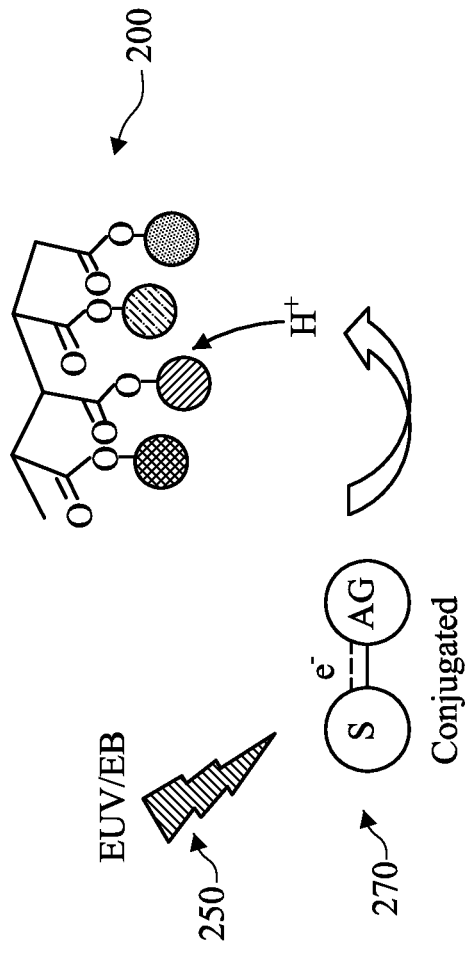

FIGS. 7A and 7B are diagrams that illustrate the mechanism in which the PAG generates acid according to different embodiments of the present disclosure. Specifically, FIG. 7A illustrates the PAG with the sensitizer moiety single bonded to the acid generator according to formulas I and II shown in FIGS. 4A and 4B, and FIG. 7B illustrates the PAG with the sensitizer moiety conjugate bonded to the acid generator according to formulas III and IV shown in FIGS. 5A and 5B.

Referring to FIG. 7A, a photoresist includes a polymer matrix 200, a photo-acid generator (PAG) 210, and a solvent (not illustrated herein). Unlike the PAGs in conventional photoresists, the PAG 210 herein contains a sensitizer moiety S bonded to an acid generator AG through a single bond. When EUV light 250 is projected onto the photoresist material, electrons e– are excited from the sensitizer moiety S and then relax to multiple secondary electrons. Due to the bonding between the sensitizer moiety S and the acid generator AG, the secondary electrons e– can efficiently transfer to the acid generator AG. Consequently, the acid generator AG can more effectively generate acid H+, which then reacts with the polymer matrix 200. In addition, the distance between the sensitizer S and the acid generator AG can be controlled to be below 20 carbon-carbon single bond connection or between about 0.5 nm and 3.0 nm by the connection of non-conjugated single bond system. This short distance (made possible by the bond between the sensitizer S and the acid generator AG) also reduces loss of secondary electrons e– before they are received by the acid generator AG. Again, this helps promote more efficient photo-acid generation. In this manner, the photoresist sensitivity and efficiency are improved.

The PAG 270 shown in FIG. 7B is similar to the PAG 210 shown in FIG. 7A, except that the sensitizer S is bonded to the acid generator through a conjugated link or conjugated bond. The conjugated bond/link serves as a pathway for the excited electrons e– to transfer from the sensitizer moiety S to the acid generator AG and then relax to multiple secondary electrons. This established pathway for the electrons e– also improves the effectiveness and efficiency of electron transfer, which in turn improves the photo-acid generation. In addition, the distance between the sensitizer S and the acid generator AG can be controlled between about 0.5 nm and 3.5 nm by the connection of conjugated system. This short distance (made possible by the conjugated bond between the sensitizer S and the acid generator AG) also reduces loss of secondary electrons e– before they are received by the acid generator AG. Therefore, the photoresist sensitivity and efficiency are improved for the embodiment of the photoresist shown in FIG. 7B as well.

Figure 8:
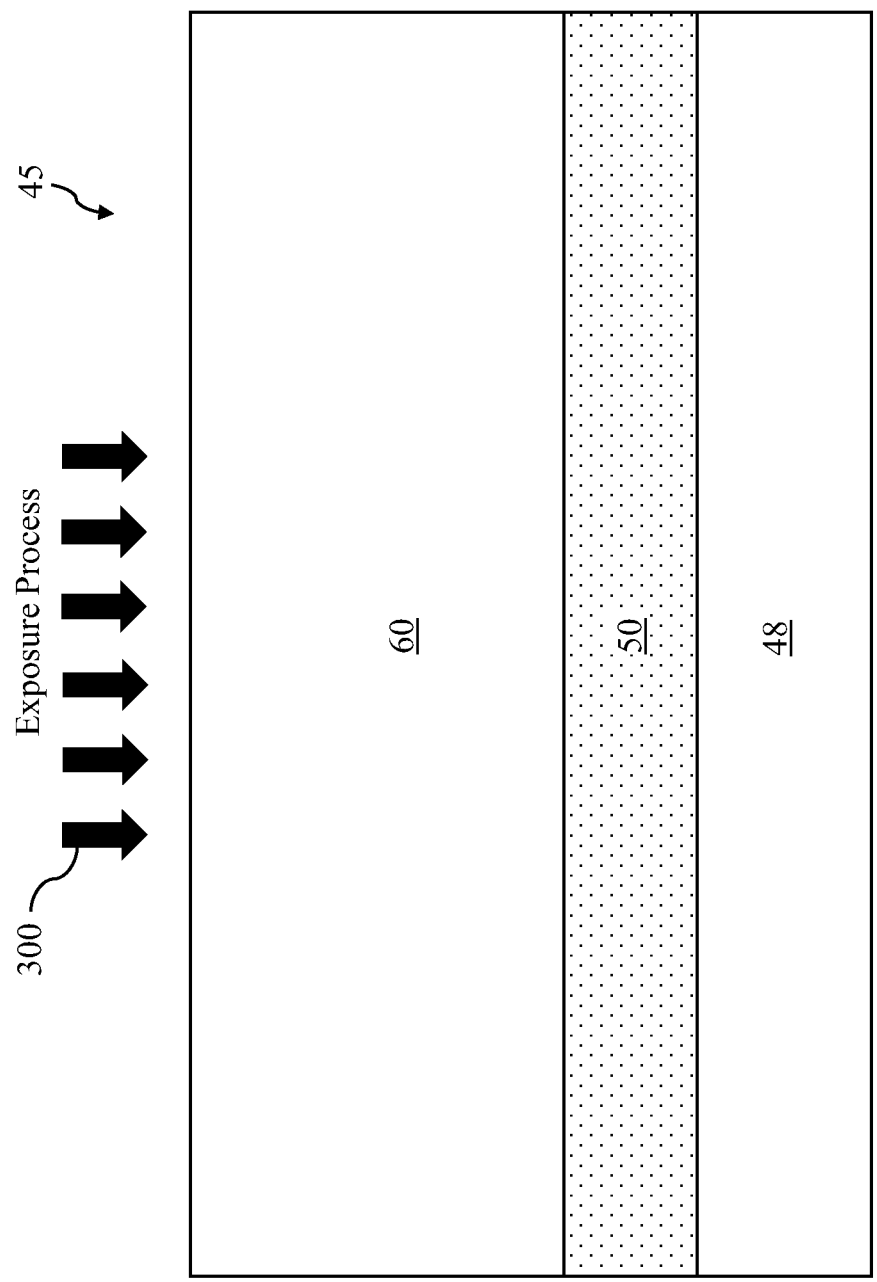

Referring now to FIG. 8, an exposure process 300 is performed to expose the photoresist layer 60. In some embodiments, the exposure process 300 applies EUV radiation to an area of the photoresist layer 60. As discussed above, due to the photoresist layer 60 containing a sensitizer bonded to an acid generator, either through single bonding or conjugated bonding, the photoresist sensitivity is enhanced.

Figure 9:
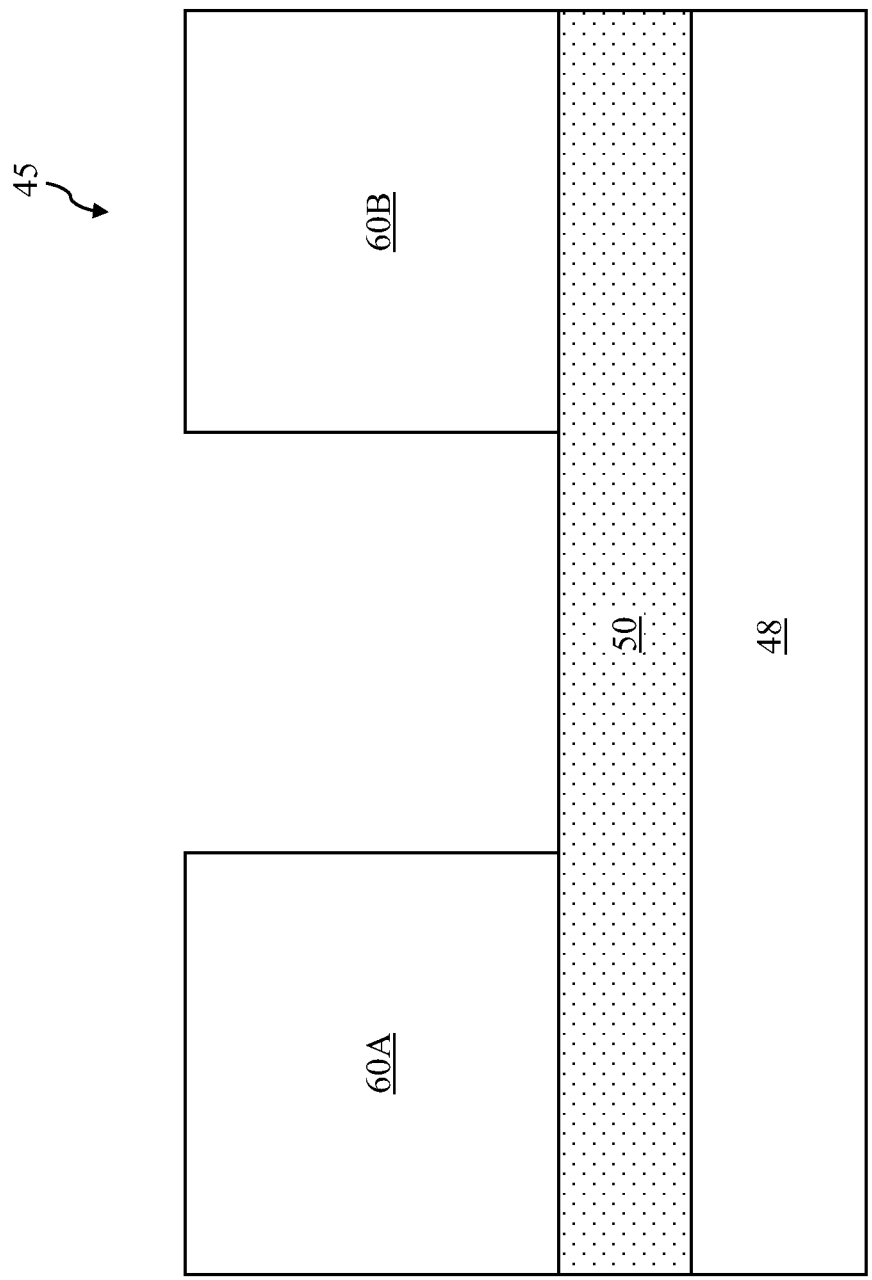
Figure 10:
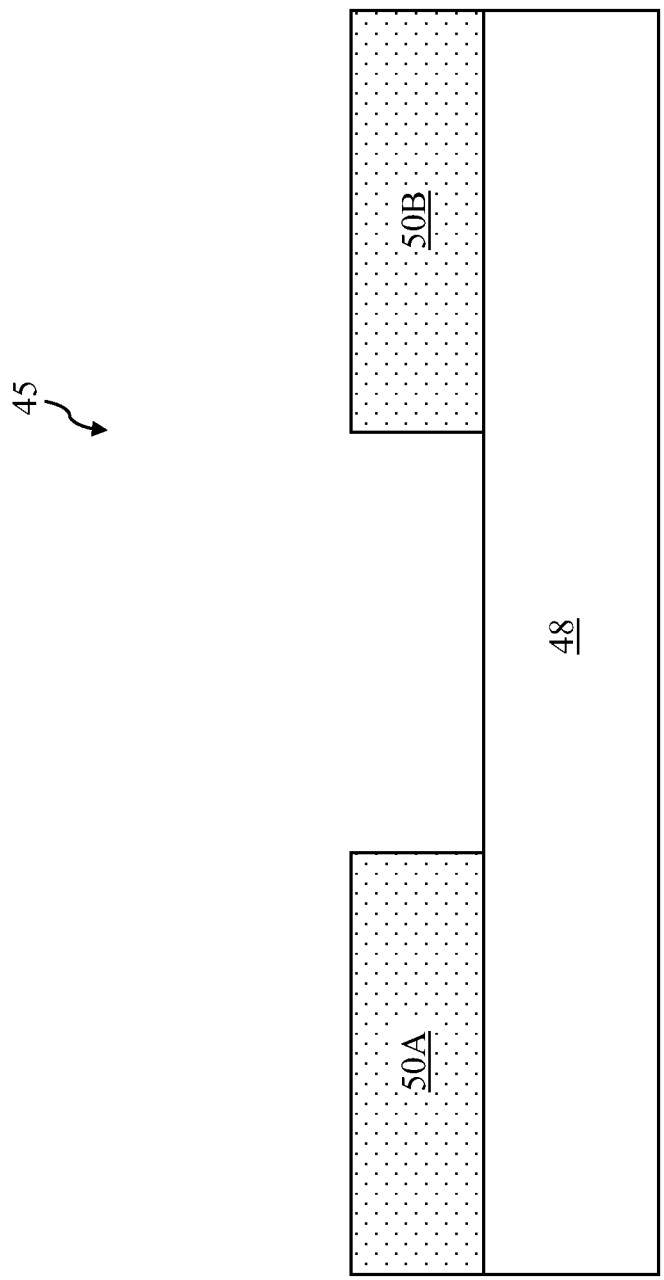

Referring now to FIG. 9, subsequent lithography processes (e.g., post-exposure baking, developing, rinsing, etc.) may be performed to form a patterned photoresist, which for the sake of simplicity is illustrated herein as photoresist segments 60A and 60B separated by a recess.

Using the patterned photoresist as a mask, additional fabrication processes such as etching or implantation may be performed. For example, referring to FIG. 10, the material layer 50 is etched into segments 50A and 50B separated by a recess. Thereafter, the patterned photoresist may be removed by a photoresist removal process known in the art, such as a stripping or an ashing process.

Although the discussions above use EUV lithography as an example, it is understood that the various aspects of the photoresist (e.g., the PAG having the sensitizer bonded to the acid generator) may apply to other types of lithography as well, such as an e-beam lithography.

Figure 11:
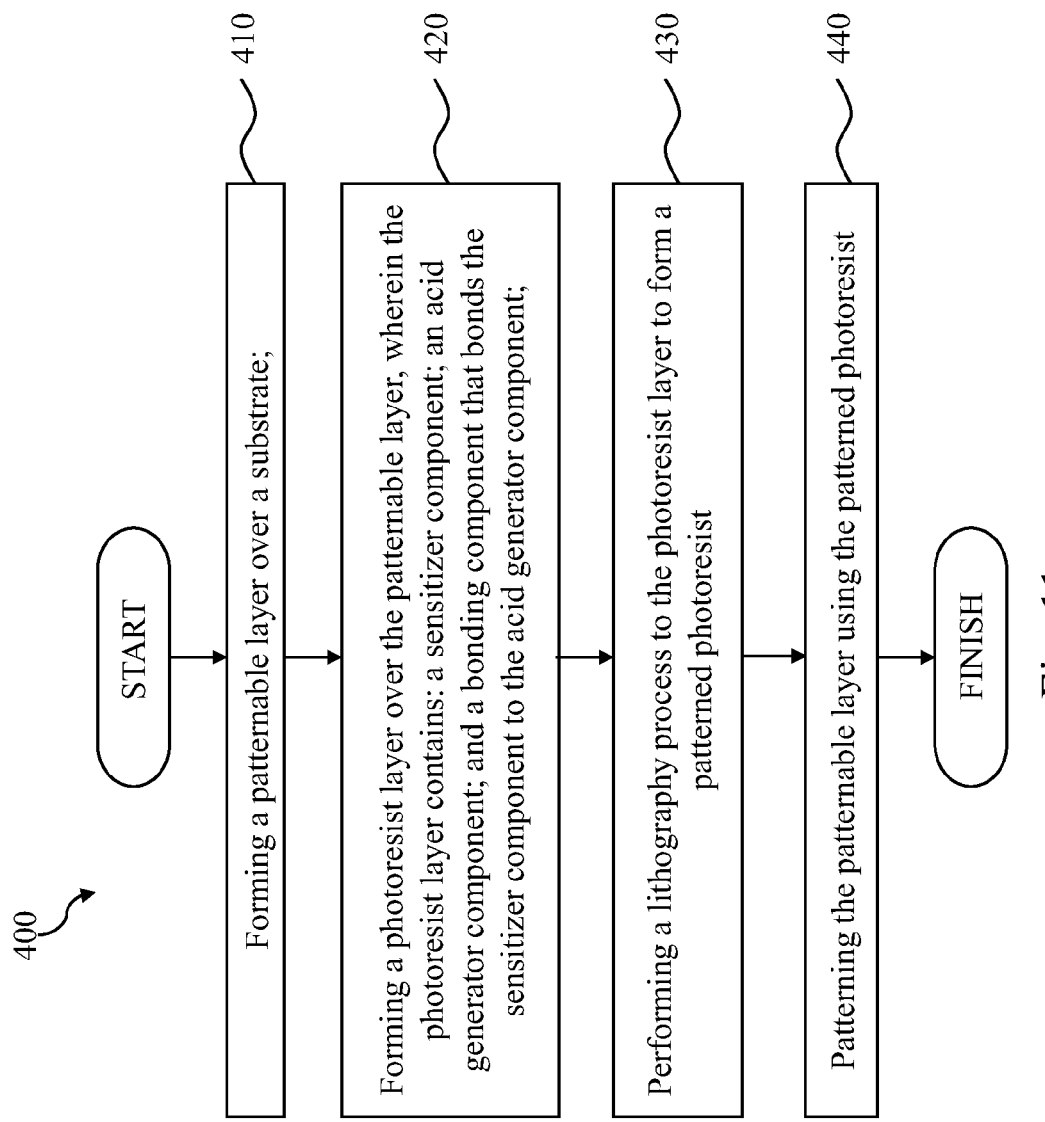
FIG. 11 is a flowchart illustrating a method of fabricating a semiconductor device in accordance with some embodiments of the present disclosure.

FIG. 11 is a flowchart of a method 400 of performing a semiconductor fabrication process according to various aspects of the present disclosure.

The method 400 includes a step 410 of forming a patternable layer over a substrate. In some embodiments, the substrate is substantially conductive or semi-conductive. The electrical resistance may be less than about $10^3$ ohm-meter. In some embodiments, the substrate contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 48 may contain Ti, Al, Co, Ru, TiN, $WN_2$, or TaN. In some other embodiments, the substrate contains a dielectric material with a dielectric constant in a range from about 1 to about 40. In some other embodiments, the substrate contains Si, metal oxide, or metal nitride, where the formula is MXb, wherein M is a metal or Si, and X is N or O, and wherein "b" is in a range from about 0.4 to 2.5. For example, the substrate may contain $SiO_2$, silicon nitride, aluminum oxide, hafnium oxide, or lanthanum oxide.

The patternable layer formed over the substrate has different optical properties than photoresist. For example, the patternable layer has a different n, k, or T value from photoresist. In some embodiments, the layer comprises at least one of different polymer structure, acid labile molecule, PAG (photo acid generator) loading, quencher loading, chromophore, cross linker, or solvent, which lead to different n value to photoresist. In some embodiments, the patternable layer and photoresist have different etching resistance. In some embodiments, the patternable layer contains an etching resistant molecule. The molecule includes low onishi number structure, double bond, triple bond, silicon, silicon nitride, Ti, TiN, Al, aluminum oxide, SiON, or combinations thereof.

The method 400 includes a step 420 of forming a photoresist layer over the patternable layer. The photoresist layer contains a sensitizer component, an acid generator component, and a bonding component that bonds the sensitizer component to the acid generator component. In some embodiments, the bonding component includes a single bond and has the following chemical formula:

wherein a is in a range between 1 and 20.

In some embodiments, the bonding component includes a conjugated bond and has a chemical formula that is one of the following:

Example for $L^1$

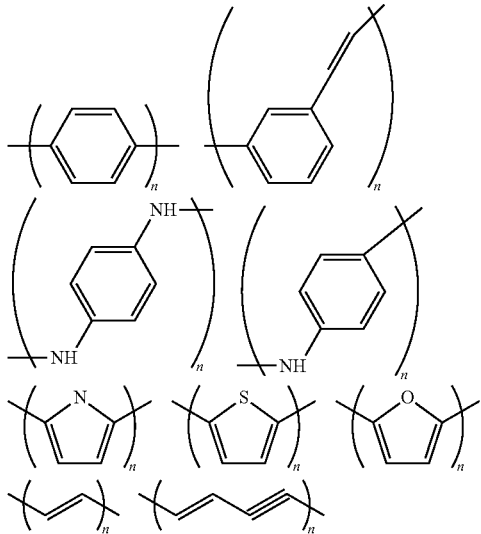

wherein n is in a range between 1 and 20.

In some embodiments, the sensitizer component contains one of the following: a metal, a metal oxide, a metal complex, aromatic carbon ring derivatives, or heterocyclic derivatives.

In some embodiments, the acid generator component has the following chemical formula:

wherein $R^1$ includes one of the following: an aromatic carbon ring, or a straight or cyclic alkyl/alkoxyl/fluoro chain with the chain carbon 1~6, or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6.

In some embodiments, the acid generator component has the following chemical formula:

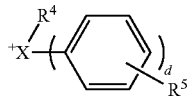

wherein $R^4$ and $R^5$ may each contain at least one of the following: an aromatic carbon ring, a straight or cyclic alkyl/alkoxyl/fluoro chain with the chain carbon 1~6, straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the chain carbon 1~6, —Cl, —Br, —I, —NO2, —SO3-, —H—, —CN, —NCO, —OCN, —CO2-, —OH, —OR*, —OC(O)CR*, —SR, —SO2N(R*)2, —SO2R*, SOR, —OC(O)R*, —C(O)OR*, —C(O)R*, —Si(OR*)3, —Si(R*)3, or epoxyl groups, wherein R* represents one of the following: H, or an unbranched or branched, cyclic or noncyclic saturated or unsaturated alkyl or alkenyl or alkynyl groups, and wherein d is in a range between 1 and 3.

The method 400 includes a step 430 of performing a lithography process to the photoresist layer to form a patterned photoresist. In some embodiments, the lithography process includes an EUV lithography process. In other embodiments, the lithography process includes an e-beam lithography process.

The method 400 includes a step 440 of patterning the patternable layer using the patterned photoresist.

It is understood that additional processes may be performed before, during, or after the steps 410-440 of the method 400 to complete the fabrication of the semiconductor device. As another example, the lithography process discussed herein may be done by exposing the photoresist layer using a radiation having a first wavelength, and the photoresist may later be exposed by a radiation having a second wavelength (e.g., as a part of a double patterning process). For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the photoresist material herein offers improved lithography performance. As discussed above, because the sensitizer moiety is bonded or linked to the acid generator of the PAG, the secondary electron transfer from the sensitizer to the acid generator can be better controlled. Not only is the distance between the sensitizer moiety and the acid generator reduced, but in some embodiments the bonding (e.g., via the conjugated bonding link) actually serves as a pathway for the electron transfer. Consequently, the acid generator is more efficient in generating the photo-acid, which leads to better photoresist sensitivity. Another advantage is that the present disclosure does not require changes to the existing lithography systems and methods. By merely swapping out the conventional photoresist with the novel photoresist herein, the present disclosure can be implemented.

One aspect of the present disclosure pertains to photoresist. The photoresist includes a polymer, and a photo-acid generator. The photo-acid generator contains a sensitizer component, an acid generator component, and a bonding component that bonds the sensitizer component to the acid generator component.

Another aspect of the present disclosure pertains to a photo-acid generator (PAG) of a photoresist. The photo-acid generator includes a sensitizer moiety, an acid generator, and a linker that links the sensitizer moiety to the acid generator via either a single link or a conjugated link.

Yet another aspect of the present disclosure pertains to a method of fabricating a semiconductor device. A patternable layer is formed over a substrate. A photoresist layer is formed over the patternable layer. The photoresist layer contains: a sensitizer component, an acid generator component, and a bonding component that bonds the sensitizer component to the acid generator component. A lithography process is performed to the photoresist layer to form a patterned photoresist. The patternable layer is patterned using the patterned photoresist.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photoresist, comprising:
   a polymer; and
   a photo-acid generator that contains:
   a sensitizer component;
   an acid generator component; and
   a bonding component that covalently bonds the sensitizer component to an anion of the acid generator component, wherein the bonding component includes a conjugated bond;
   wherein the bonding component has a chemical formula that is one of the following:

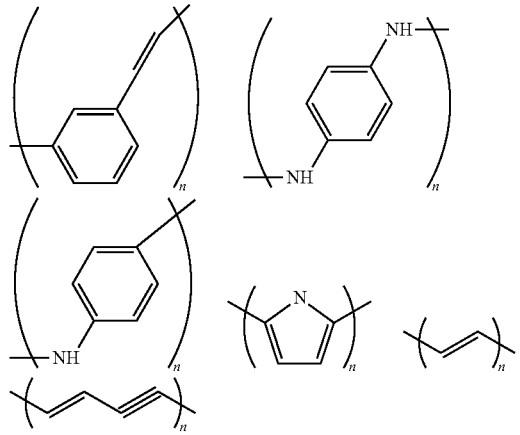

wherein n is in a range between 1 and 20.

2. The photoresist of claim 1, wherein the sensitizer component contains one of the following: a metal, a metal oxide, a metal complex, aromatic carbon ring derivatives, or heterocyclic derivatives.

3. The photoresist of claim 1, wherein the acid generator component has the following chemical formula:

wherein $R^1$ comprises an aromatic carbon ring.

4. The photoresist of claim 1, wherein the acid generator component has the following chemical formula:

wherein $R^1$ comprises a straight alkyl chain of 1-6 carbon atoms.

5. The photoresist of claim 1, wherein the acid generator component has the following chemical formula:

wherein $R^1$ comprises a cyclic alkyl chain of 3-6 carbon atoms.

6. The photoresist of claim 1, wherein the acid generator component has the following chemical formula:

wherein $R^1$ comprises a straight alkene, alkyne, hydroxyl, ketone, aldehyde, carbonate, carboxylic acid, ester, ether, amide, amine, imine, imide, azide, nitrate, nitrile, nitrite or thiol functional group.

7. The photoresist of claim 1, wherein the acid generator component has the following chemical formula:

wherein $R^1$ comprises a cyclic alkene, alkyne, hydroxyl, ketone, aldehyde, carbonate, carboxylic acid, ester, ether, amide, amine, imine, imide, azide, nitrate, nitrile, nitrite or thiol functional group.

8. The photoresist of claim 1, wherein the sensitizer component is configured to absorb extreme ultraviolet (EUV) light to produce electrons.

9. The photoresist of claim 1, wherein a distance between the sensitizer component and the acid generator component is in a range from about 0.5 nanometers to 3.5 about nanometers.

10. A photo-acid generator (PAG) of a photoresist, comprising:
    a sensitizer moiety;
    an acid generator; and
    a linker that covalently links the sensitizer moiety to an anion of the acid generator via a conjugated link, and wherein the conjugated link has a chemical formula that is one of the following:

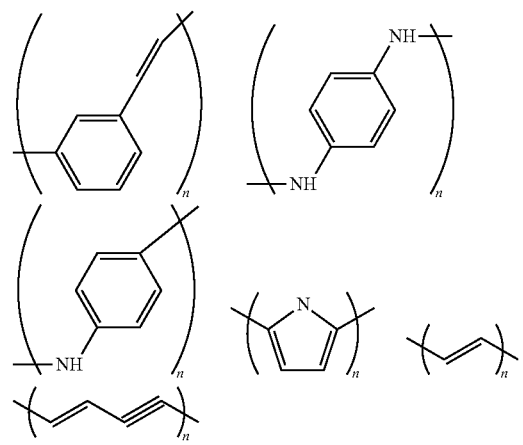

wherein n is in a range between 1 and 20.

11. The photo-acid generator of claim 10, wherein the sensitizer moiety is configured to absorb extreme ultraviolet (EUV) light to produce electrons, and wherein the acid generator has the following chemical formula:

wherein $R^1$ comprises an alkyl chain of 1-6 carbon atoms.

12. The photo-acid generator of claim 10, wherein the sensitizer moiety is configured to absorb extreme ultraviolet (EUV) light to produce electrons, and wherein the acid generator has the following chemical formula:

wherein $R^1$ comprises an alkene, alkyne, hydroxyl, ketone, aldehyde, carbonate, carboxylic acid, ester, ether, amide, amine, imine, imide, azide, nitrate, nitrile, nitrite or thiol functional group.

13. The photo-acid generator of claim 10, wherein the sensitizer moiety is configured to absorb extreme ultraviolet (EUV) light to produce electrons.

14. The photo-acid generator of claim 13, wherein the conjugated link provides a pathway for the electrons to transfer from the sensitizer moiety to the acid generator.

15. A photo-sensitive material, comprising:
a sensitizer component configured to absorb extreme ultraviolet (EUV) light to produce electrons;
an acid generator component; and
a conjugated bonding component that covalently bonds the sensitizer component to an anion of the acid generator component;
wherein the conjugated bonding component has a chemical formula that is one of the following:

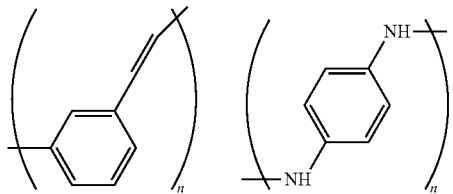

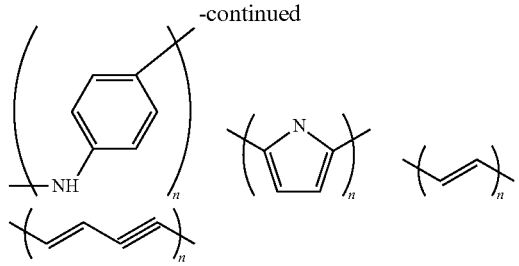

wherein n is in a range between 1 and 20.

16. The photo-sensitive material of claim 15, wherein the sensitizer component contains one of the following: a metal, a metal oxide, a metal complex, aromatic carbon ring derivatives, or heterocyclic derivatives.

17. The photo-sensitive material of claim 15, wherein the photo-sensitive material is a negative photoresist.

18. The photo-sensitive material of claim 15, wherein the acid generator component has the following chemical formula:

wherein $R^1$ comprises an alkyl chain of 1-6 carbon atoms.

19. The photo-sensitive material of claim 15, wherein the acid generator component has the following chemical formula:

wherein $R^1$ comprises an alkene, alkyne, hydroxyl, ketone, aldehyde, carbonate, carboxylic acid, ester, ether, amide, amine, imine, imide, azide, nitrate, nitrile, nitrite or thiol functional group.

* * * * *